United States Patent
Fang et al.

(10) Patent No.: US 9,871,531 B1
(45) Date of Patent: Jan. 16, 2018

(54) NON-GEOMETRIC SCALING CURRENT STEERING DIGITAL TO ANALOG CONVERTER

(71) Applicant: GLOBALFOUNDRIES INC., Grand Cayman (KY)

(72) Inventors: Sher J. Fang, Allen, TX (US); Sherif H. K. Embabi, Allen, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/412,193

(22) Filed: Jan. 23, 2017

(51) Int. Cl.
*H03M 1/68* (2006.01)

(52) U.S. Cl.
CPC .................................... *H03M 1/68* (2013.01)

(58) Field of Classification Search
None
See application file for complete search history.

(56) References Cited

U.S. PATENT DOCUMENTS

| 6,927,719 B1* | 8/2005 | Siniscalchi | H03M 1/0604 341/144 |
| 6,958,719 B2* | 10/2005 | Moon | H03M 1/687 341/135 |
| 9,203,350 B2* | 12/2015 | Dempsey | H03F 1/223 |
| 2014/0340150 A1 | 11/2014 | Dempsey et al. | |
| 2015/0244390 A1* | 8/2015 | Teterwak | H03M 1/745 341/144 |

* cited by examiner

*Primary Examiner* — Howard Williams
(74) *Attorney, Agent, or Firm* — David Cain; Hoffman Warnick LLC

(57) ABSTRACT

Aspects of the present disclosure include a digital-to-analog converter (DAC). The DAC includes an output node and a plurality of equal sized cell transistors. Each of the plurality of equal sized cell transistors represents a distinct bit, the distinct bits including a least significant bit (LSB). The plurality of equal sized cell transistors are connected to the output node. The DAC includes at least one control circuit configured to modify a back gate voltage of one of the equal sized cell transistors representing the LSB to adjust a current output.

17 Claims, 4 Drawing Sheets

US 9,871,531 B1

NON-GEOMETRIC SCALING CURRENT STEERING DIGITAL TO ANALOG CONVERTER

FIELD OF THE INVENTION

The present application relates generally to an improved current steering digital to analog converter (DAC) circuit using non-geometric scaling technique.

BACKGROUND

Current steering DACs are commonly implemented in segmentation form which is a compromise between performance and complexity. The segmentation of the current steering DAC is divided into two parts: the most significant bit (MSB) section and the least significant bit (LSB) section. The MSB section uses thermometer coding for accuracy and the LSB section uses binary coding to save area and complexity of decoding. Integral non-linearity (INL) is a measure showing how much the DAC transfer characteristic deviate from an ideal one. That is, the ideal characteristic is usually a straight line; INL shows how much the actual voltage at a given code value differs from that line, in LSBs (1 LSB steps). The (INL) requirement of a DAC depends on the matching of these unit cells. INL determines the resolution and accuracy of the DAC and the matching is inversely proportional to the size of the unit cell.

BRIEF SUMMARY

A first embodiment of the present disclosure provides a digital-to-analog converter (DAC). The DAC includes an output node and a plurality of equal sized cell transistors. Each of the plurality of equal sized cell transistors represents a distinct bit, the distinct bits including a least significant bit (LSB). The plurality of equal sized cell transistors are connected to the output node. The DAC includes at least one control circuit configured to modify a back gate voltage of one of the equal sized cell transistor representing the LSB to adjust a current output.

A second embodiment of the present disclosure provides a digital-to-analog converter (DAC). The DAC includes a plurality of stages, each stage comprising an equal sized cell transistor, all but one of the equal sized cell transistors having a backgate control from a control circuit. Each of the stages represents a distinct bit. The plurality of stages are connected to an output node. The control circuit is configured to modify a voltage of the backgate of one of the equal cell size transistors to adjust the current.

A third embodiment of the present disclosure provides a segmented digital-to-analog converter (DAC) having M bits thermometer segment and N bits binary segment. The segmented DAC includes a plurality of binary stages, N, each of the N binary stages including an equal sized cell transistor. At least one of the equal sized cell transistors is electrically connected to a backgate control circuit. Each of the stages represents a distinct bit and the plurality of distinct bits includes a least significant bit (LSB). The plurality of stages are connected to an output node. The backgate control circuit is configured to modify a voltage of one of the equal cell size transistors to adjust the current of the one of the stages. The segmented DAC includes ($2^M-1$) thermometer stages. Each thermometer stage includes a cell transistor and each of the ($2^M-1$) thermometer stages is connected to the output node.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

A thermometer coded DAC contains an equal current-source segment for each possible value of DAC output. A binary coded DAC contains binary weighted current sources that are connected to a summing point. These precise currents sum to the correct output value. A segmented DAC, which use a combination of the above techniques in a single converter, takes advantage of the monotonicity of the thermometer coded architecture and smaller area of a binary coded one. The binary coded cells represent the LSBs and the thermometer coded cells represent the MSBs. For a segmented DAC having M bits for the thermometer coding and N bits for the binary coding, there would be N binary coded cells and $2^M-1$ thermometer coded cells.

Figure 1:
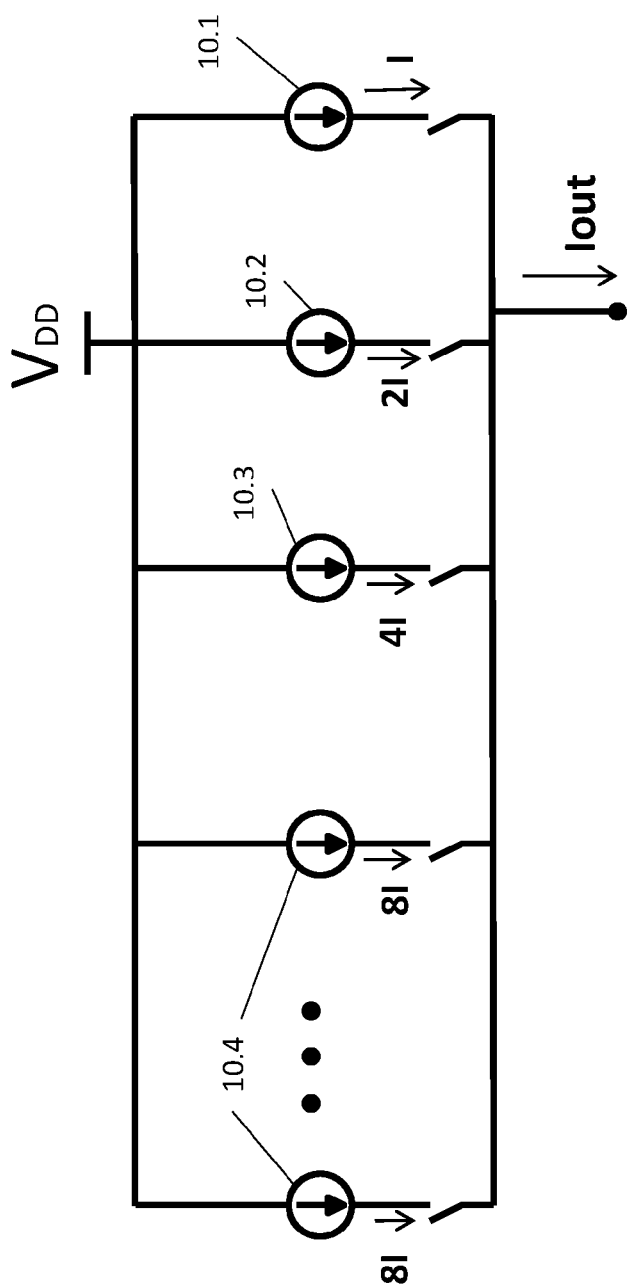
FIG. 1 illustrates a prior art embodiment of a digital to analog converter circuit.

Shown in FIG. 1 is conventional 6-bit 3-3 segmented digital to analog converter (DAC) including scaled binary current sources. FIG. 1 shows current mirror transistors 10.1, 10.2, 10.3 and 10.4. Transistor 10.1 is the smallest having a size of S. Transistor 10.2 has a size of 2 S. Transistor 10.3 has a size of 4 S. Transistors 10.4 have a size of 8 S. In FIG. 1, there are seven 10.4 transistors or cells, ie ($2^3-1=7$). The dots in FIG. 1 are to represent the five other 10.4 transistors. For the binary coded section, transistor 10.1 produces a current I when enabled, transistor 10.2 produces a current 2I and transistor 10.3 produces a current 4I. As for the thermometer coded section, transistors 10.4 produce a current 8I. The size of the unit cell, S, will determine the matching characteristics of the DAC which in turn determines the achievable INL of the DAC.

Rather than scaling the transistors in binary fashion to output the desire scaled current, disclosed herein is a DAC wherein at least two of the unit cell transistors in the binary coded section are the same size. The bits corresponding to LSBs are then adjusted through a backgate bias voltage on a particular unit cell transistor. For example, in a 6 bit DAC, if the size of the LSB+1 cell is chosen to be the unit cell, the size of LSB cell will be the same as the LSB+1 cell and a circuit adjusts the backgate so that the output current is half of that in the LSB+1 cell. The LSB+1 cell will have a current 2I and the LSB cell will have a current I. The unit cell size chosen is dependent on the matching requirement of the DAC. Since area is inversely proportional to $\varphi$, the standard deviation, the bigger the size of the unit cell the better the matching. So, when the unit cell in the proposed non-geometric scaling DAC is chosen to be at LSB+1, then the required unit cell size can be smaller than the LSB+1 of the geometric scaled counterpart.

Figure 2:
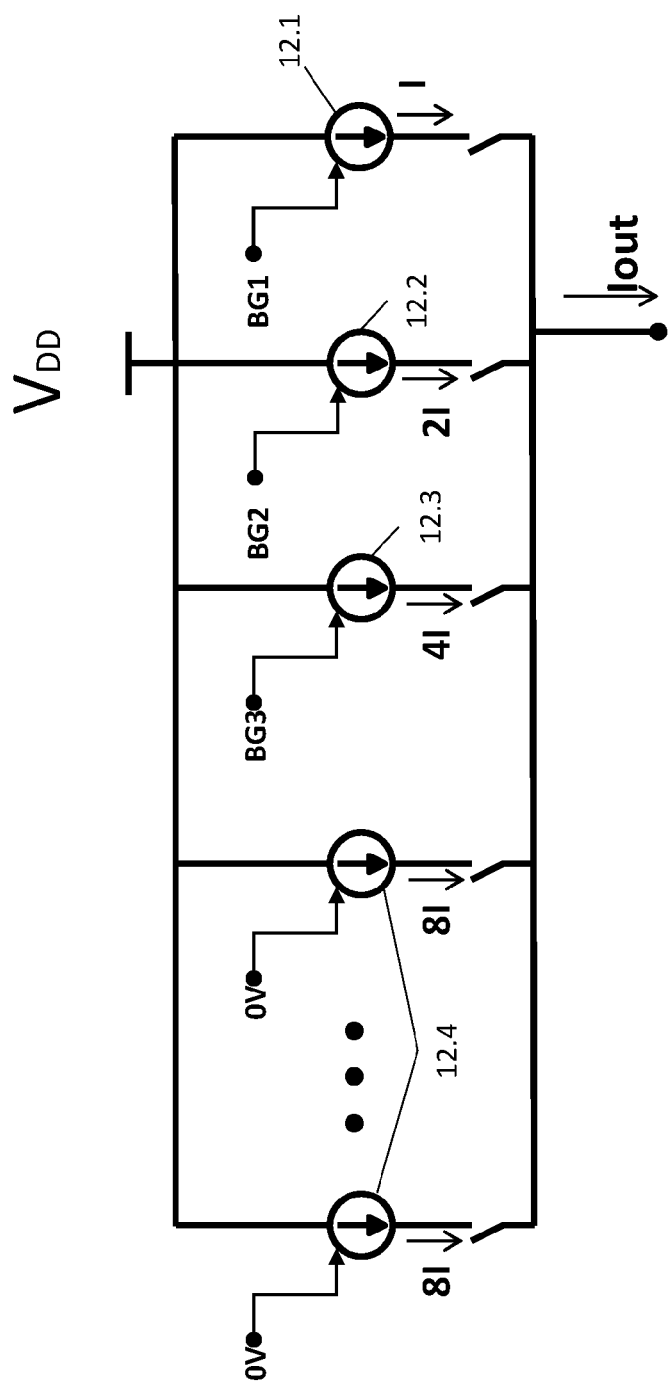
FIG. 2 illustrates an embodiment of a digital to analog converter circuit.

Shown in FIG. 2 is an example of a 6 bit 3-3 segmented DAC according to an embodiment of the disclosure herein. FIG. 2 shows current mirror transistors, 12.1, 12.2, 12.3 and 12.4 which are all of the same size. Current scaling is achieved by using control circuits (BG1, BG2, BG3) while keeping the size of the transistors (12.1, 12.2, 12.3 and 12.4) fixed (e.g. mxS). Thus, as shown in FIG. 2, a relatively large size (mxS) transistor can be used for each unit cell. This configuration relieves the tough matching requirements for high resolution DAC with high linearity requirement as is the case for conventional approach (FIG. 1). In FIG. 2, BG1 is programmed to provide a backgate voltage to transistor 12.1, reducing the output current by a factor of 8 to I. BG2 is programmed to provide a backgate voltage to transistor 12.2 reducing the output current by a factor of 4 to 2 I. BG3 is programmed to provide a backgate voltage to transistor 12.3 reducing the output current by a factor of 2 to 4 I. FIG. 2 also shows transistors 12.4, which are the same size of the transistors 12.1 12.2 and 12.3 and have no backgate voltage applied. The output current of transistors 12.4 is 8 I. As in FIG. 1, there are seven 10.4 transistors. The dots in FIG. 2 represent the 12.4 additional transistors.

The embodiment in FIG. 2 can be extended to a different number of bits and different unit cell matching accuracy depending on the linearity requirements. The current output for the distinct bit representing the LSB is a multiple of 0.5 of a current of a unit cell having no control circuit.

Figure 3:
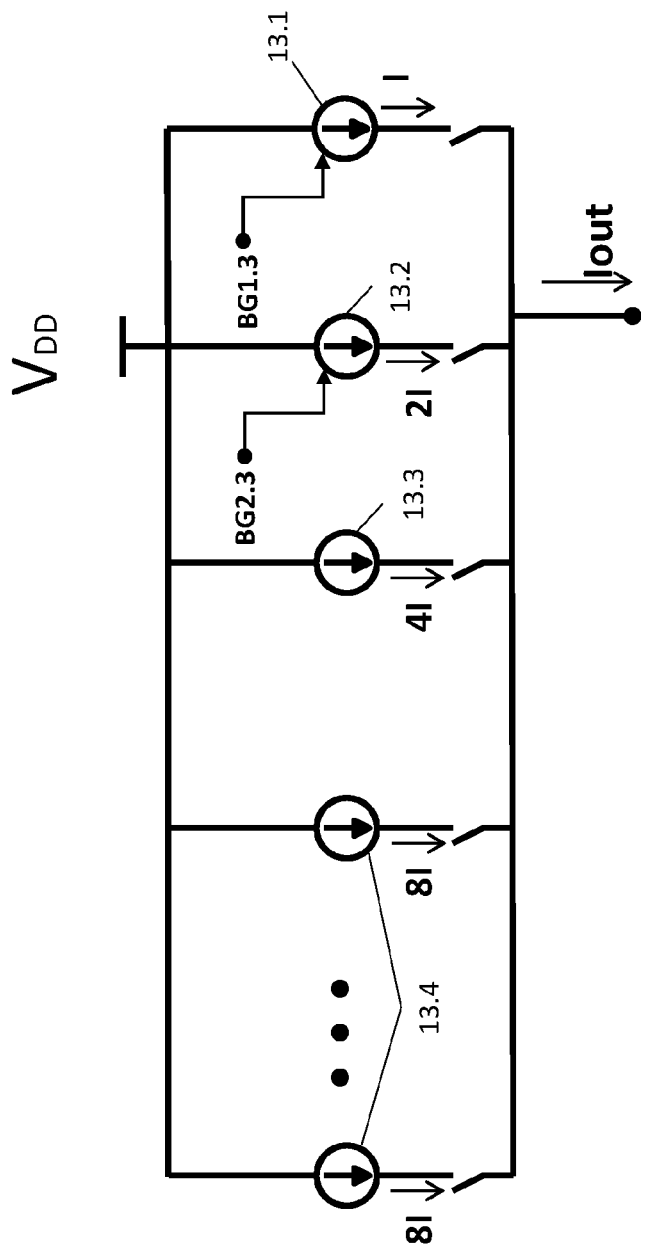
FIG. 3 illustrates an embodiment of a digital to analog converter circuit.

Shown in FIG. 3 is a DAC according to another embodiment of the disclosure herein. FIG. 3 shows three current mirror transistors, 13.1, 13.2 and 13.3 which are all of the same size. Current scaling is achieved by using control circuits (BG1.3 and BG2.3) while keeping the size of the transistors (13.1, 13.2 and 13.3) fixed (e.g. mxS). Thus, a relatively large size (mxS) transistor can be used for the unit cell for LSB and LSB+1 in FIG. 3. Transistors 13.1, 13.2 and 13.3 are the binary coded section of the DAC. As with FIG. 2, the tough matching requirements for high resolution DAC with high linearity requirement is eased. As shown in FIG. 3, BG1.3 is programmed to provide a backgate voltage to transistor 13.1, reducing the output current by a factor of 4 to I. BG2.3 is programmed to provide a backgate voltage to transistor 13.2 reducing the output current by a factor of 2 to 2 I. In the embodiment shown in FIG. 3, there is no backgate voltage provided to transistor 13.3, (i.e. 0V) and the output current is 4 I. FIG. 3 also shows transistors 13.4, which are twice the size of the transistors 13.1 13.2 and 13.3 and output twice the current of transistor 13.3. The output current of transistor(s) 13.4 is 8 I.

Figure 4:
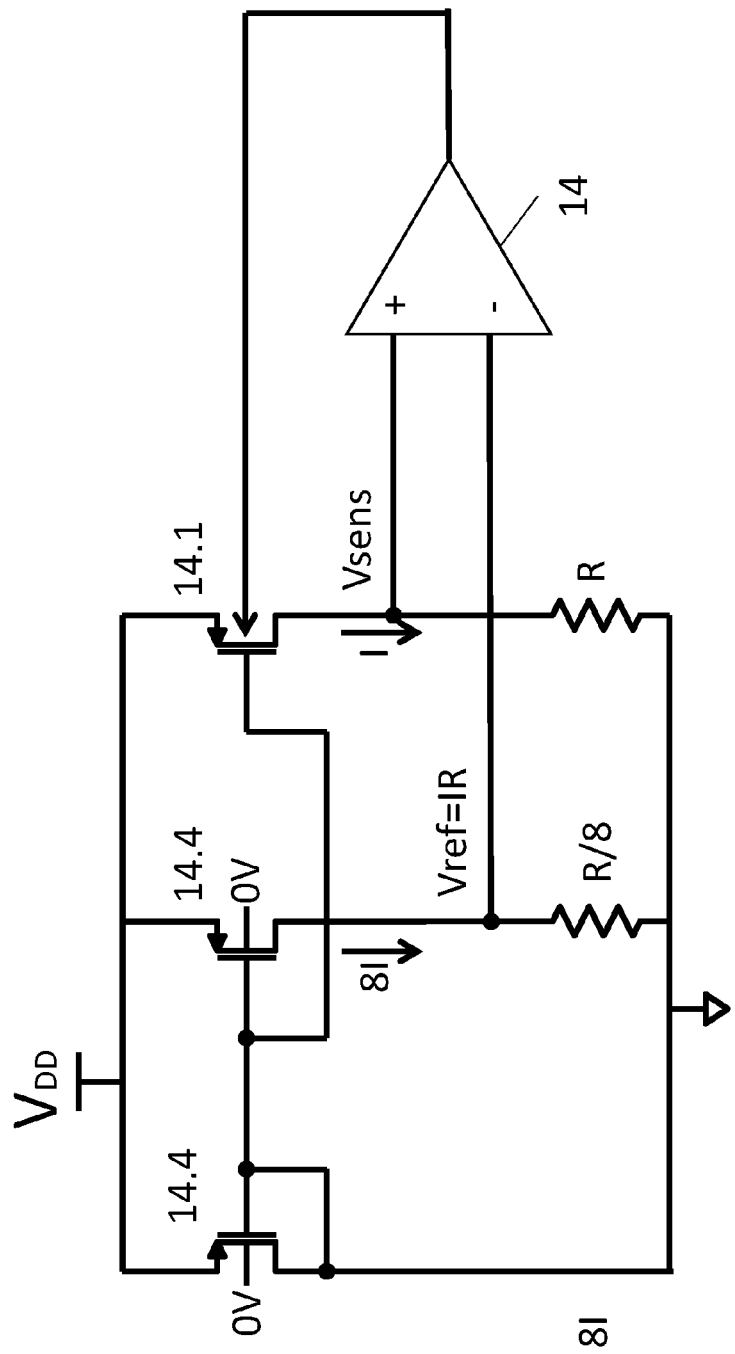
FIG. 4 illustrates an embodiment of a self-calibrating backgate voltage circuit for a digital to analog converter circuit.

FIG. 4 shows an embodiment of a self-calibrating backgate bias circuit that is suitable for use to provide BG1 in FIG. 2. In FIG. 4, current from 14.4 is multiplied by R/8 to determine the reference voltage (Vref). A negative feedback system embodied by differential amplifier 14 senses the output voltage, Vsens and this is used to adjust the backgate of transistor 14.1 such that the output current of the transistor is reduced by a factor of 8. The self-calibrating backgate bias circuit can be used to provide BG1 in FIG. 2. Without a feedback loop, backgate bias on a transistor can be manually tuned.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A digital-to-analog converter (DAC) comprising:
   an output node;
   a plurality of equal sized cell transistors, each of the plurality of equal sized cell transistors representing a distinct bit, the plurality of distinct bits including a least significant bit (LSB), the plurality of equal sized cell transistors connected to the output node; and
   at least one control circuit configured to modify a back gate voltage of one of the equal sized cell transistors representing the LSB to adjust a current, wherein the current for the distinct bit representing the LSB is a multiple of 0.5 of a current of a unit cell having no control circuit.

2. The DAC according to claim 1, wherein there are N distinct bits and N−1 control circuits.

3. The DAC according to claim 1, wherein each equal sized cell transistor is a current mirror transistor.

4. The DAC according to claim 1, wherein the at least one control circuit determines a backgate bias voltage output of an equal sized cell transistor representing the LSB.

5. The DAC according to claim 4, wherein the at least one control circuit includes a differential amplifier.

6. A digital-to-analog converter (DAC) comprising:
   a plurality of stages, each stage comprising an equal sized cell transistor, all but one of the equal sized cell transistors having being electrically connected to a backgate control circuit, each of the stages representing a distinct bit, the plurality of stages connected to an output node, wherein the distinct bits include a most significant bit (MSB) and a least significant bit (LSB)

and the MSB is represented by the transistor having no backgate control circuit; and the backgate control circuit configured to modify a backgate voltage of one of the equal cell size transistors to adjust the current of the one of the stages.

7. The DAC according to claim 6, wherein at least one backgate control circuit modifies the backgate voltage of the equal sized cell transistor of the stage representing the LSB.

8. The DAC according to claim 6, wherein there are N distinct bits and N−1 control circuits.

9. The DAC according to claim 6, wherein the current for the distinct bit representing the LSB is a multiple of 0.5 of a current of a unit cell having no control circuit.

10. The DAC according to claim 6, wherein each transistor is a current mirror transistor.

11. A segmented digital-to-analog converter (DAC) comprising:

M thermometer bits and N binary bits;

a plurality of binary stages, N, each of the N binary stages comprising an equal sized cell transistor, at least one of the equal sized cell transistors being electrically connected to a backgate control circuit, each of the stages representing a distinct bit, the plurality of distinct bits including a least significant bit (LSB), the plurality of stages connected to an output node;

the backgate control circuit configured to modify a backgate voltage of one of the equal cell size transistors to adjust the current of the one of the stages wherein the current for the distinct bit representing the LSB is a multiple of 0.5 of a current of an equal sized unit cell transistor having no backgate control circuit; and ($2^M$−1) thermometer stages, each thermometer stage comprising a cell transistor, each of the ($2^M$−1) thermometer stages connected to the output node.

12. The segmented DAC according to claim 11, wherein each equal sized cell transistor is a current mirror transistor.

13. The segmented DAC according to claim 11, wherein there are N distinct bits and N−1 control circuits.

14. The segmented DAC according to claim 11, wherein the backgate control circuit determines a voltage output of an equal sized cell transistor having no control circuit and a voltage output of the equal sized cell transistor representing the LSB.

15. The segmented DAC according to claim 14, wherein the at least one control circuit includes a differential amplifier.

16. The segmented DAC according to claim 11, wherein each of the cell transistors of the $2^M$−1 thermometer stages is the same size as the equal size cell transistor.

17. The segmented DAC according to claim 11, wherein at least one of the cell transistors of the $2^M$−1 thermometer stages is a larger size than the equal size cell transistor.

* * * * *